(12) United States Patent
Shen

(10) Patent No.: US 9,536,603 B2
(45) Date of Patent: *Jan. 3, 2017

(54) METHODS AND APPARATUSES FOR DETERMINING THRESHOLD VOLTAGE SHIFT

(71) Applicant: Micron Technology, Inc., Boise, ID (US)

(72) Inventor: Zhenlei Shen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 159 days.

This patent is subject to a terminal disclaimer.

(21) Appl. No.: 14/335,572

(22) Filed: Jul. 18, 2014

(65) Prior Publication Data

US 2015/0016186 A1 Jan. 15, 2015

Related U.S. Application Data

(63) Continuation of application No. 13/335,309, filed on Dec. 22, 2011, now Pat. No. 8,797,805.

(51) Int. Cl.
*G11C 11/34* (2006.01)
*G11C 11/56* (2006.01)
*G11C 16/04* (2006.01)
*G11C 16/34* (2006.01)

(52) U.S. Cl.
CPC ....... *G11C 11/5642* (2013.01); *G11C 16/0483* (2013.01); *G11C 16/3404* (2013.01)

(58) Field of Classification Search
CPC ............ G11C 11/5642; G11C 16/0483; G11C 16/3404

See application file for complete search history.

(56) References Cited

U.S. PATENT DOCUMENTS

| 6,301,151 | B1 | 10/2001 | Engh et al. |
| 7,237,074 | B2 | 6/2007 | Guterman et al. |
| 7,492,634 | B2 | 2/2009 | Li et al. |
| 7,633,808 | B2 | 12/2009 | Ban |
| 7,663,930 | B2 | 2/2010 | Aritome |
| 7,848,152 | B1 | 12/2010 | Huang et al. |

(Continued)

OTHER PUBLICATIONS

U.S. Appl. No. 13/600,563, entitled, Inferring Threshold Voltage Distributions Associated With Memory Cells Via Interpolation, filed Aug. 31, 2012, Zhenlei Shen, et al., (35 pgs.).

(Continued)

*Primary Examiner* — Pho M Luu
*Assistant Examiner* — Mohammed A Bashar
(74) *Attorney, Agent, or Firm* — Brooks, Cameron & Huebsch, PLLC

(57) ABSTRACT

Apparatuses and methods for determining threshold voltage shift are described. A number of methods for determining threshold voltage shift in memory cells include determining changes in threshold voltage for memory cells at each data state of a first number of data states by searching threshold voltage data of memory cells programmed to the first number of data states and determining changes in threshold voltage for memory cells at each data state of a second number of data states by searching threshold voltage data of memory cells programmed to the second number of data states within a range of threshold voltages, wherein the range is shifted from a previous range based on the changes in threshold voltage for memory cells programmed to the first number of data states.

20 Claims, 4 Drawing Sheets

(56) References Cited

U.S. PATENT DOCUMENTS

| | | |
|---|---|---|
| 7,889,563 B2 | 2/2011 | Cho et al. |
| 7,944,751 B2 | 5/2011 | Torrisi et al. |
| 8,009,472 B2 | 8/2011 | Murin et al. |
| 8,077,515 B2 | 12/2011 | Shen et al. |
| 8,315,092 B2 | 11/2012 | Strasser et al. |
| 8,380,915 B2 | 2/2013 | Wood et al. |
| 8,531,888 B2 | 9/2013 | Chilappagari et al. |
| 2011/0216599 A1 | 9/2011 | Namiki et al. |
| 2011/0280084 A1 | 11/2011 | Radke et al. |
| 2011/0289376 A1 | 11/2011 | Maccarrone et al. |
| 2012/0134213 A1 | 5/2012 | Choi et al. |
| 2012/0182810 A1 | 7/2012 | Radke et al. |
| 2012/0240011 A1 | 9/2012 | Helm et al. |
| 2012/0262991 A1 | 10/2012 | Ghilardelli |

OTHER PUBLICATIONS

U.S. Appl. No. 13/413,130, entitled, "Memory and Sense Parameter Determination Methods," filed Mar. 6, 2012, Zhenlei Shen, et al., (25 pgs.).

METHODS AND APPARATUSES FOR DETERMINING THRESHOLD VOLTAGE SHIFT

PRIORITY INFORMATION

This application is a Continuation of U.S. application Ser. No. 13/335,309, filed Dec. 22, 2011, which will issue as U.S. Pat. No. 8,797,805 on Aug. 5, 2014, which is incorporated by reference.

TECHNICAL FIELD

The present disclosure relates generally to semiconductor memory and methods, and more particularly, to methods and apparatuses for determining threshold voltage shift.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players, e.g., MP3 players, and movie players, among other electronic devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a targeted, e.g., desired, data state. For example, electric charge can be placed on or removed from a charge storage structure, e.g., a floating gate or charge trap, of a memory cell to put the cell into one of a number of data states. As memory cells are erased and programmed a number of times, the amount of electric charge stored by a cell can increase from the desired amount of electric charge stored by a cell for a particular data state. As memory cells remain static, the amount of electric charge stored by a cell can decrease from the desired amount of electric charge stored by a cell for a particular data state. The increase and/or decrease of electric charge stored by a cell from the amount of desired electric charge stored by a cell can cause errors when sensing a cell using sensing signals that are based on the desired electric charge stored by a cell.

DETAILED DESCRIPTION

Figure 1:
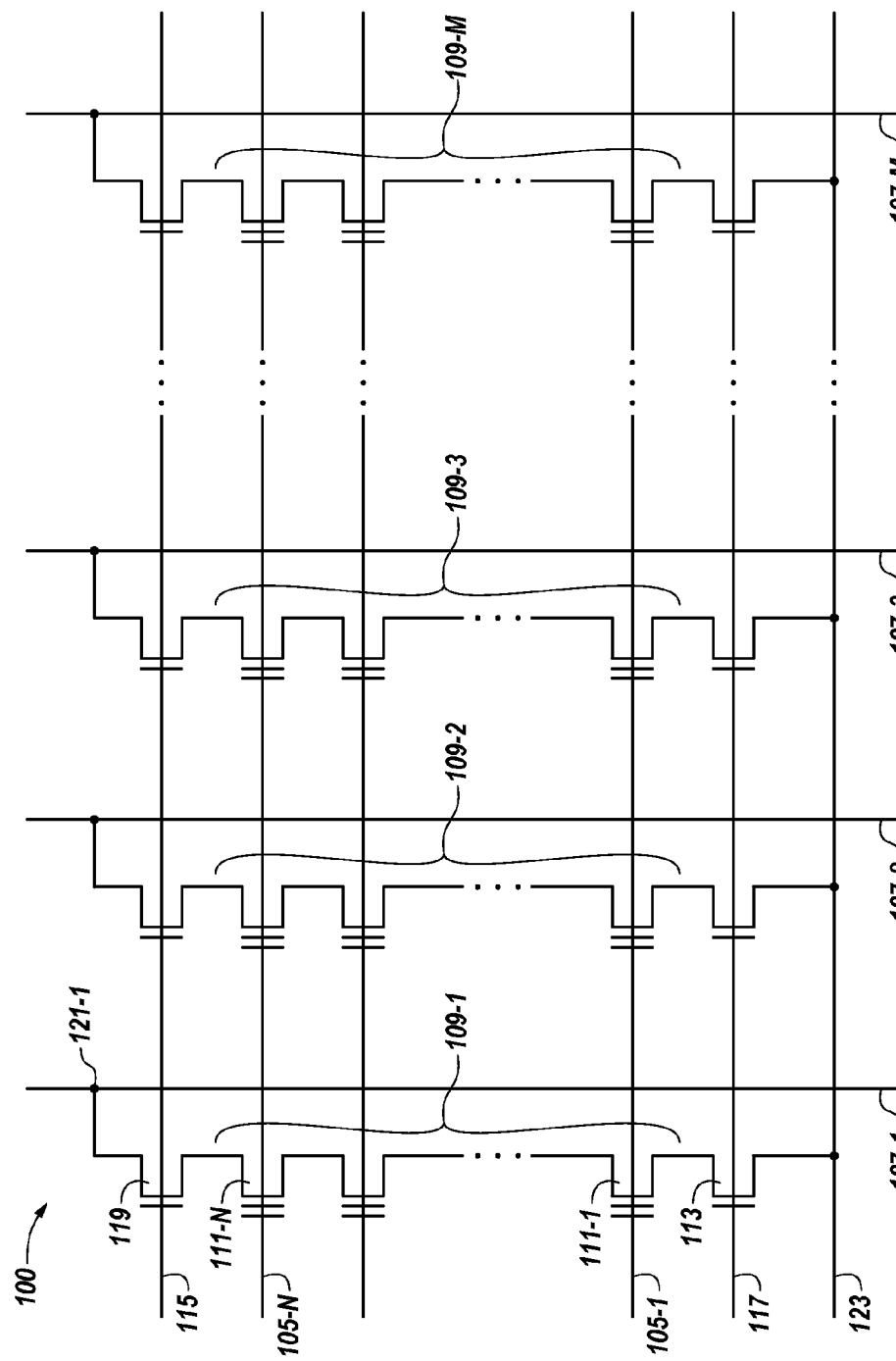
FIG. 1 is a schematic of a portion of an apparatus in the form of a non-volatile memory array in accordance with a number of embodiments of the present disclosure.

The present disclosure includes apparatuses and methods for determining threshold voltage shift. A number of methods for determining threshold voltage shift in memory cells include determining changes in threshold voltage for memory cells at each data state of a first number of data states by searching threshold voltage data of memory cells programmed to the first number of data states and determining changes in threshold voltage for memory cells at each data state of a second number of data states by searching threshold voltage data of memory cells programmed to the second number of data states within a range of threshold voltages, wherein the range is shifted from a previous range based on the changes in threshold voltage for memory cells programmed to the first number of data states.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, the designators "N" and "M", particularly with respect to reference numerals in the drawings, indicates that a number of the particular feature so designated can be included with a number of embodiments of the present disclosure. Additionally, as used herein, "a number of" something can refer to one or more of such things. For example, a number of memory devices can refer to one or more memory devices.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 400 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a schematic of a portion of an apparatus in the form of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, the memory array 100 includes access lines, e.g., word lines 105-1, ..., 105-N and intersecting data lines, e.g., local bit lines 107-1, 107-2, 107-3, ..., 107-M. For ease of addressing in the digital environment, the number of word lines 105-1, ..., 105-N and the number of local bit lines 107-1, 107-2, 107-3, ..., 107-M can be some power of two, e.g., 256 word lines by 4,096 bit lines.

Memory array 100 includes NAND strings 109-1, 109-2, 109-3, ..., 109-M. Each NAND string includes non-volatile memory cells 111-1, ..., 111-N, each communicatively coupled to a respective word line 105-1, ..., 105-N. Each NAND string (and its constituent memory cells) is also associated with a local bit line 107-1, 107-2, 107-3, ..., 107-M. The memory cells 111-1, ..., 111-N of each NAND string 109-1, 109-2, 109-3, ..., 109-M are connected in series source to drain between a source select gate (SGS), e.g., a field-effect transistor (FET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In a number of embodiments, construction of the non-volatile memory cells 111-1, ..., 111-N includes a source, a drain, a floating gate or other charge storage structure, and a control gate. The memory cells 111-1, ..., 111-N have their control gates coupled to a word line, 105-1, ..., 105-N, respectively. A NOR array architecture would be similarly laid out, except that the string of memory cells would be coupled in parallel between the select gates.

As one of ordinary skill in the art will appreciate, a number, e.g., a subset or all, of cells coupled to a selected word line, e.g., 105-1, ..., 105-N, can be programmed and/or sensed, e.g., read, together as a group. A number of cells programmed and/or sensed together can correspond to a page of data. In association with a sensing operation, a number of cells coupled to a particular word line and programmed together to respective data states can be referred to as a target page. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a targeted data state.

A sensing operation, such as a read or program verify operation, can include sensing a voltage and/or current change of a bit line coupled to a selected cell in order to determine the data state of the selected cell. The sensing operation can include precharging a bit line and sensing the discharge when a selected cell begins to conduct.

Sensing the data state of a selected cell can include providing a number of sensing signals, e.g., read voltages, to a selected word line while providing a number of voltages, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing signal applied to the selected word line. For example, the data state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data state of the selected cell can be determined based on the current and/or voltage sensed on the bit line corresponding to the string. For instance, the data state of the selected cell can be determined based on whether the bit line current changes by a particular amount or reaches a particular level in a given time period.

As an example, the memory cells of an array such as array 100 can be single level cells (SLCs) or multi-level cells (MLCs). SLCs can be single-bit, e.g., two-state, memory cells. That is, the cells can be programmed to one of two data states, e.g., L0 and L1, respectively. In operation, a number of memory cells, such as in a selected block, can be programmed such that they have a Vt level corresponding to either L0 or L1. As an example, data state L0 can represent a stored data value such as binary "1". Data state L1 can represent a stored data value such as binary "0".

MLCs can be two-bit, e.g., four-state; 2.25-bit, e.g., five-state; 2.5-bit, e.g., six-state; 2.75-bit, e.g., seven-state; three-bit, e.g., eight-state; or four-bit, e.g., sixteen state, memory cells, among other number of bits. For example, the cells can be programmed to one of four data states, e.g., L0, L1, L2, and L3, respectively, in a two-bit memory cell. In operation, a number of memory cells, such as in a selected block, can be programmed such that they have a Vt level corresponding to either L0, L1, L2, or L3. As an example, data state L0 can represent a stored data value such as binary "11". Data state L1 can represent a stored data value such as binary "10". Data state L2 can represent a stored data value such as binary "00". Data state L3 can represent a stored data value such as binary "01". However, embodiments are not limited to these data assignments.

Figure 2A:
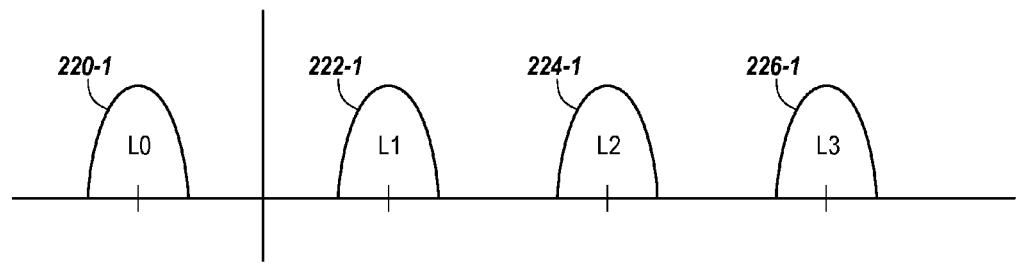
FIGS. 2A-2C are diagrams illustrating a number of threshold voltage distributions corresponding to data states associated with memory cells programmed in accordance with a number of embodiments of the present disclosure.
Figure 2B:
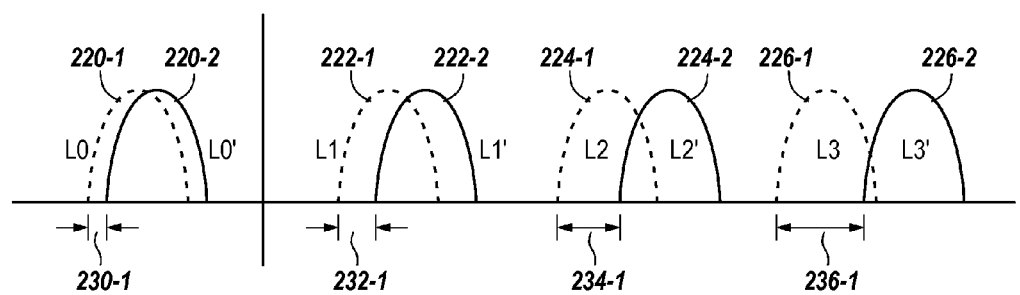
Figure 2C:
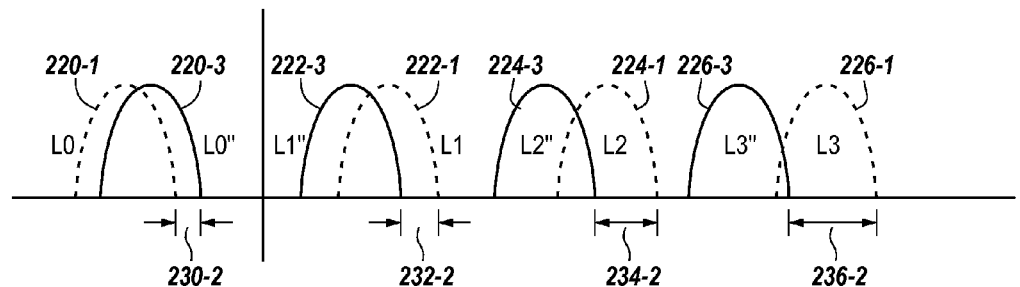

FIGS. 2A-2C are diagrams illustrating a number of threshold voltage distributions corresponding to data states associated with memory cells programmed in accordance with a number of embodiments of the present disclosure. The memory cells associated with FIGS. 2A-2C can be memory cells such as cells 111-1, ..., 111-N described in connection with FIG. 1. The memory cells associated with FIGS. 2A-2C are two-bit, e.g., four-state, MLCs. However, embodiments of the present disclosure are not limited to this example.

The Vt distributions 220-1, 222-1, 224-1, and 226-1 of FIG. 2A correspond to a number of memory cells programmed to one of four data states, e.g., L0, L1, L2, or L3. The Vt distributions 220-2, 222-2, 224-2, and 226-2 of FIG. 2B correspond to the number of memory cells associated with FIG. 2A after a number of cycling operations, e.g., program/erase cycles, have shifted the Vt distributions. The Vt distributions 220-3, 222-3, 224-3, and 226-3 of FIG. 2C correspond to the number of memory cells associated with FIG. 2A after the Vt distributions have shifted due to data states of the memory cells remaining static, e.g., the memory cells remain at a data state for a period of time.

In FIG. 2A, threshold voltage distributions 220-1, 222-1, 224-1, and 226-1 correspond to a number of memory cells that are initially programmed to a first, a second, a third, or a fourth data state, e.g., L0, L1, L2, or L3. In a number of embodiments, additional programming and/or erasing of the number of memory cells can cause the threshold voltages for memory cells at the four data states to change as illustrated in FIG. 2B by threshold voltage distributions 220-2, 222-2, 224-2, and 226-2. For example, memory cells programmed to the first data state are illustrated by the L0' threshold distribution 220-2 and the threshold voltage distribution has shifted by an amount indicated by shift 230-1, memory cells programmed to the second data state are illustrated by the L1' threshold distribution 222-2 and the threshold voltage distribution has shifted by an amount indicated by shift 232-1, memory cells programmed to the third data state are illustrated by the L2' threshold distribution 224-2 and the threshold voltage distribution has shifted by an amount indicated by shift 234-1, and memory cells programmed to the fourth data state are illustrated by the L3' threshold distribution 226-2 and the threshold voltage distribution has shifted by an amount indicated by shift 236-1. In a number of embodiments, data states closer to an erased state, such as L0, can shift less than data states that are further from the erased state. The shifts in the threshold distributions 230-1, 232-1, 234-1, and 236-1 can be caused by additional program and/or erase cycles performed on the number of memory cells.

In a number of embodiments, data states of the memory cells remaining static can cause the threshold voltages for memory cells at the four data states to change as illustrated in FIG. 2C by threshold voltage distributions 220-3, 222-3, 224-3, and 226-3. The memory cells can lose charge over time when the data states of the memory cells remain static causing the threshold voltage of the memory cells to shift towards 0 volts. For example, memory cells programmed to the first data state are illustrated by the L0" threshold distribution 220-3 and the threshold voltage distribution has shifted by an amount indicated by shift 230-2, memory cells programmed to the second data state are illustrated by the L1" threshold distribution 222-3 and the threshold voltage distribution has shifted by an amount indicated by shift 232-2, memory cells programmed to the third data state are illustrated by the L2" threshold distribution 224-3 and the threshold voltage distribution has shifted by an amount indicated by shift 234-2, and memory cells programmed to the fourth data state are illustrated by the L3" threshold distribution 226-3 and the threshold voltage distribution has shifted by an amount indicated by shift 236-2. The shifts in the threshold distributions 230-2, 232-2, 234-2, and 236-2 can be caused by charge loss in the memory cells while they are retained at a data state without additional program cycles being performed on the memory cells.

In a number of embodiments, threshold voltage data can be acquired from hard and/or soft data associated with a number of memory cells. The hard and/or soft data associated with a number of memory cells can be determined via sensing operations on the number of memory cells. The data acquired during the sensing operations can be stored in memory cells on an array of memory cells that includes the memory cells that were sensed to acquire the data and/or another memory device that does not include the memory cells that were sensed to acquire the data.

In a number of embodiments, threshold voltage data that is used to form the voltage threshold distributions can be searched to determine changes in threshold voltages for memory cells at each data state of a number of data states. In a number of embodiments, the changes in threshold voltages can be a change in average threshold voltage for each data state of the number of data states. In a number of embodiments, the changes in threshold voltages can be a change in the threshold voltage where a threshold voltage distribution of each data state of the number data states intersects a threshold voltage distribution of an adjacent data state. For example, when threshold voltage distributions become closer to together and overlap due to charge loss and/or a reduction in the programming window of memory cells, threshold voltage distributions for adjacent data states can intersect. In a number of embodiments, the changes in threshold voltages that are determined for each data state can be used in further processing of the data associated with each data state, e.g., the hard and/or soft data associated with each data state. For example, the changes in threshold voltages that are determined for each data state can be used to make projections on distributions statistics for each data state.

In a number of embodiments, threshold voltage data can include current and prior threshold voltage data for memory cells programmed to a number of data states. When searching the threshold voltage data, each data state of a number of data states can be associated with a search range. The search range associated with each data state can define the range of threshold voltages searched within the threshold voltage data to determine the number of memory cells programmed to a particular data state. For example, the search range associated with the first data state, L0, can be 0.5 volts. Therefore, when searching for threshold voltage data associated with the first data state, threshold voltage data for memory cells having threshold voltages between −0.8 and −0.3 volts is searched.

In a number of embodiments, threshold voltage data can be searched within the search range associated with each data state of a number of data states to determine changes in threshold voltages from previous threshold voltages for memory cells programmed to each data state of the number of data states. For example, shift 230-1 for memory cells programmed to the first data state L0 can be determined by searching threshold voltage data within the search range associated with the first data state. The threshold voltage data having threshold voltages between −0.8 and −0.3 volts can be searched to determine that the average threshold voltage for memory cells at the first data state has shifted by an amount 230-1, such as 0.05 V, for example.

In a number of embodiments, the search ranges associated with each data state of the number of data states can be adjusted based on changes in threshold voltage for memory cells programmed to a number of data states that were previously determined using the search ranges associated with the number of data states. The search range associated with a data state can be adjusted based on an average change in threshold voltage for a number of data states, a linear extrapolation of the change in threshold voltage for a number of data states, and/or data in a table that indicates the change in threshold voltage for a number of data states. For example, the search range associated with the second data state L1 and used to determine shift 232-1 can be adjusted based on shift 230-1 that was determined using the search range associated with the first data state L0. For example, the second data state having a search range of 0.5 volts would search threshold voltage data for memory cells having threshold voltages of 0.4 to 0.9 volts. The search range can be shifted 0.05 volts to search threshold voltage data for memory cells having threshold voltages of 0.45 to 0.95 volts based on the shift of the threshold voltage of the memory cells at the first program state. The search range associated with the third data state L2 and used to determine shift 234-1 can be adjusted based on shift 230-1, that was determined using the search range associated with the first data state L0, and shift 232-1, that was determined using the adjusted search range associated with the second data state L1. The adjustment made to the search range associated with the third data state L2 can be based on the average of shift 230-1 and 232-1, a linear extrapolation of shift 230-1 and shift 232-1, or based on a table having data indicating shift 230-1 and shift 232-1.

In a number of embodiments, threshold voltage data for memory cells programmed to a number of data states can be searched within an initial search range for each data state of a first number of data states. For example, the initial search range can include a range of +/−0.25 volt from the desired threshold voltage for each data state of the first number of data states. The change in threshold voltages for each data state of the first number of data states can be determined when searching the threshold voltage data within the initial search range associated with each data state. The change in threshold voltages for each of the first number of data states can be used to adjust a search range associated with each data state of a second number of data states. For example, the search range for each data state can be adjusted to include a range of −0.2 to +0.3 volts from the desired threshold voltage for each data state of the second number data states. In a number of embodiments, the search range for each data state can be adjusted independently for each of the number of data states.

In a number of embodiments, the data states associated with an array of memory cells can be grouped together into a number of groups of data states. The change in threshold voltages for a first number of data states determined by searching threshold voltage data can be used to shift a search range for searching threshold voltage data to determine the change in threshold voltages for a second number of data states. As used herein, "first" and "second" are only used to distinguish one group of data states from another, and should not be read to imply any particular order or number of data states. Then, the change in threshold voltages for the second number of data states can be used to shift a search range for searching threshold voltage data to determine the change in threshold voltages for a third number of data states. This process can be used to determine a change in threshold voltages and a shift of the search range for searching threshold voltage data for each data state of a number of groups of data states. For example, a first number of data states can include a first, a second, a third, and a fourth data state. A second number of data states can include a fifth and a sixth data state and a third number of data states can includes a seventh and an eighth data state. In another example, a first number of data states can include a first, a second, and a third data state. A second number of data states can include a fourth, a fifth, and a sixth data state and a third number of data states can includes a seventh and an eighth data state. In a number of embodiments, each group of a number of data states can include various numbers of data states. The number of data states grouped together can be adjusted so that the number of data states can be used to sufficiently shift a search range for searching threshold voltage data for subsequent data states, e.g., the search range is shifted so that the threshold voltage data searched includes threshold voltage data for the subsequent data states.

Figure 3:
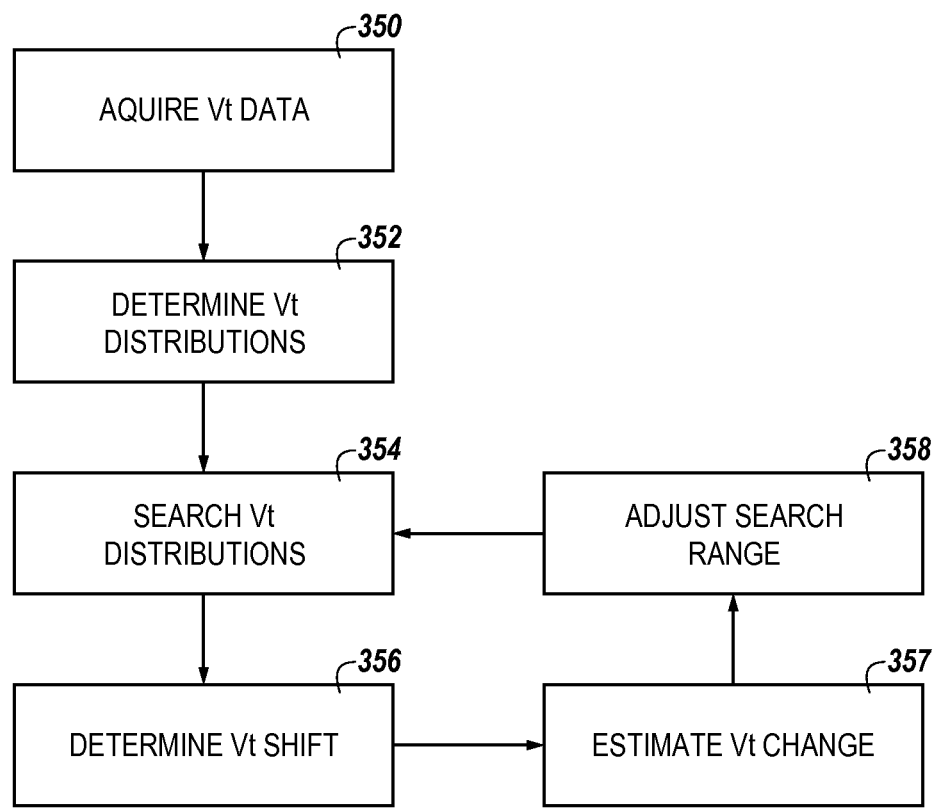
FIG. 3 illustrates a method flow diagram for determining threshold voltage shift in a memory device in accordance with a number of embodiments of the present disclosure.

FIG. 3 illustrates a method flow diagram for determining threshold voltage shift in a memory device in accordance with a number of embodiments of the present disclosure. At step 350, current and prior threshold voltage data for memory cells programmed to a number of data states is acquired. Threshold voltage data can be acquired from soft data associated with memory cells stored in a location in a memory apparatus, among other locations. The threshold voltage data acquired in step 350 is used to determine current and prior threshold voltage distributions for memory cells programmed to a number of data states at step 352.

At step 354, threshold voltage data forming the threshold voltage distributions is searched within a search range of threshold voltages associated with each data state of a number of data states. At step 356, changes in threshold voltages of memory cells programmed to each data state of the number of data states are determined, along with the average threshold voltage for each programs state and/or the threshold voltage where the threshold voltage distributions of each data state intersect with an adjacent data state. The changes in threshold voltages of memory cells programmed to each data state of the number of data states are determined via the search of the threshold voltage data. At step 357, an estimate of a change in threshold voltages of memory cells programmed to each data state of subsequent data states is determined based on the changes in threshold voltages of memory cells programmed to each data state of the number of data states. At step 358, the estimate of the change in threshold voltages of memory cells programmed to each data state of subsequent data states, which is based on the changes in threshold voltages of memory cells programmed to each data state of the number of data states, is used to adjust the search ranges used when searching the threshold voltage data associated with subsequent data states, such as in step 354. The changes in threshold voltages of memory cells programmed to each data state of the number of data states determined in step 356 can be used to estimate the change in threshold voltages of memory cells programmed to each data state of subsequent data state and adjust search ranges because data states can shift in similar manners, therefore changes in threshold voltages for some data states can be used to approximate, e.g., estimate and/or predict, where to search for the threshold voltages of memory cells programmed to other data states.

In a number of embodiments, the threshold voltage shifts that are determined in step 358 can be used to shift the sensing signals that are used during a sensing operation on the number of memory cells. As threshold voltages associated with data states shift, the sensing signals associated with the data states may also be shifted to avoid errors in the sensing operation. The sensing signals associated with the data states can be shifted to reduce sensing operation errors. The sensing signals can be shifted such that shifted sensing signals are between two adjacent threshold voltage distributions that have shifted and/or the intersection of adjacent threshold voltage distributions that have shifted.

Figure 4:
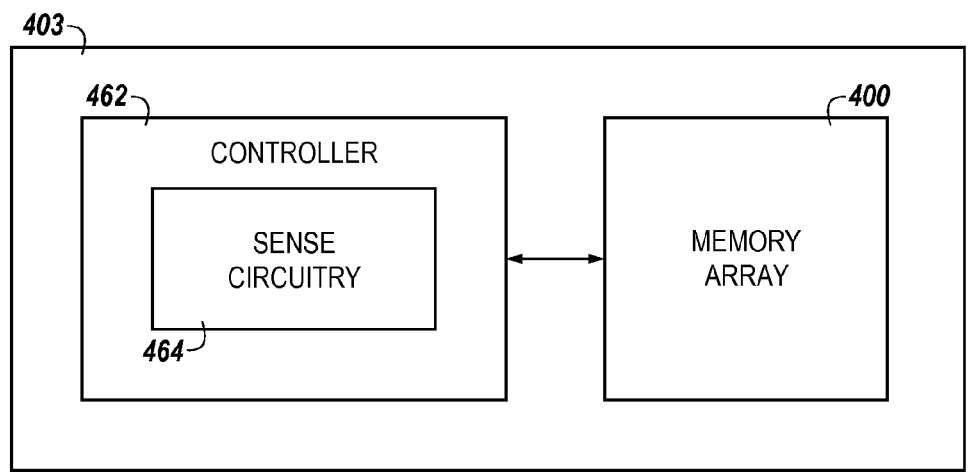
FIG. 4 is a functional block diagram of an apparatus in the form of a memory system including at least one memory device in accordance with a number of embodiments of the present disclosure.

FIG. 4 is a functional block diagram of an apparatus in the form of a memory system including at least one memory device 403 in accordance with a number of embodiments of the present disclosure. As shown in FIG. 4, memory device 403 includes memory array 400. Memory array 400 can be, for example, memory array 100 previously described in connection with FIG. 1. Memory array 400 can include, for example, single level memory cells (SLCs) and/or multi-level memory cells (MLCs). In a number of embodiments, memory array 400 may not include reference memory cells, e.g., memory array 400 may include only data memory cells.

In a number of embodiments, a memory system can be coupled to a host (not shown in FIG. 4), as part of a computing system. In a number of embodiments, an apparatus can be a memory array, a memory device, and/or a system, such as a memory system and/or a computing system.

As shown in FIG. 4, memory device 403 also includes controller 462 coupled to memory array 400. The controller 462 includes sense circuitry 464. Controller 462 can determine changes in the threshold voltages (Vts), e.g., Vt distributions, Vt levels such as mean Vt levels, and/or Vt distribution widths, associated with the memory cells in memory array 400 via threshold voltage data that can be stored in the memory array 400, among other locations. The threshold voltage data in memory array 400 can include soft data. Controller 462 can then adjust, e.g., change, sensing signals associated with sense circuitry 464 to sense a state of the memory cells based on the determined Vt changes. Sense circuitry 464 can then sense a state of the memory cells in memory array 400 using the adjusted Vts. That is, controller 462 can compensate for Vt changes in the memory cells in memory array 400.

The embodiment illustrated in FIG. 4 can include additional circuitry that is not illustrated so as not to obscure embodiments of the present disclosure. For example, memory device 403 can include address circuitry to latch address signals provided over I/O connectors through I/O circuitry. Address signals can be received and decoded by a row decoder and a column decoder, to access memory array 400. It will be appreciated by those skilled in the art that the number of address input connectors can depend on the density and architecture of memory device 403 and/or memory array 400.

CONCLUSION

The present disclosure includes apparatuses and methods for determining threshold voltage shift. A number of methods for determining threshold voltage shift in memory cells include determining changes in threshold voltage for memory cells at each data state of a first number of data states by searching threshold voltage data of memory cells programmed to the first number of data states and determining changes in threshold voltage for memory cells at each data state of a second number of data states by searching threshold voltage data of memory cells programmed to the second number of data states within a range of threshold voltages, wherein the range is shifted from a previous range based on the changes in threshold voltage for memory cells programmed to the first number of data states.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for determining threshold voltage shift in memory cells, comprising:
   determining changes in threshold voltage for memory cells at a first data state by searching threshold voltage data of memory cells programmed to the first data state having threshold voltages within a first range of threshold voltages; and
   determining changes in threshold voltage for memory cells at a second data state by searching threshold voltage data of memory cells programmed to the second data state having threshold voltages within a second range of threshold voltages, wherein the second range is shifted from a previous range based on the changes in threshold voltage for memory cells programmed to the first data state, wherein the first data state is different than the second data state.

2. The method of claim 1, wherein the second range is shifted based on a linear extrapolation of the changes in threshold voltage for memory cells at the first data state.

3. The method of claim 1, wherein the second range is shifted based on an average change of the changes in threshold voltage for memory cells at the first data state.

4. The method of claim 1, wherein the second range is shifted based on a table indicating the changes in threshold voltage for memory cells at the first data state.

5. The method of claim 1, wherein determining the changes in threshold voltage for memory cells at the first data state includes determining a change in average threshold voltage for the first data state using a controller in a memory device.

6. The method of claim 1, wherein determining the changes in threshold voltage for memory cells at the first data state includes determining a change in threshold voltage of memory cells for the first data state at an intersection with an adjacent data state using a controller in a memory device.

7. A method for operating an array of memory cells, comprising:
   determining changes in threshold voltage for memory cells programmed to each data state of a first number of data states by searching threshold voltage data of memory cells programmed to the first number of data states having threshold voltages within a first range of threshold voltages; and
   shifting a second range of threshold voltages used to search threshold voltage data when determining changes in threshold voltage for memory cells programmed to each data state of a second number of data states, wherein the second range is shifted from a previous range based on the changes in threshold voltage for memory cells programmed to each data state of the first number of data states, wherein the first number of data states are different than the second number of data states.

8. The method of claim 7, including determining changes in threshold voltage for memory cells programmed to the second number of data states by searching a memory device for threshold voltage data of memory cells programmed to each data state of the second number of data states within the second range of threshold voltages.

9. The method of claim 8, including shifting sensing signals associated with each data state of the second number of data states based on the changes in threshold voltage for memory cells programmed to each data state of the first number of data states.

10. The method of claim 8, wherein determining changes in threshold voltage for memory cells at each of the first number of data states determines the change in average threshold voltage using a controller in a memory device.

11. The method of claim 8, wherein determining the changes in threshold voltage for memory cells programmed to each data state of the first number of data states determines the change in threshold voltage of memory cells where each data state of the first number of data states intersects with an adjacent data state.

12. The method of claim 8, wherein the first number of data states includes a first and a second data state and the second number of data states includes a third and a fourth data state.

13. The method of claim 8, including determining changes in threshold voltage for memory cells programmed to each data state of a first number of data states by searching a memory device for threshold voltage data of memory cells programmed to each data state of the first number of data states within a third range of threshold voltages that is shifted from the second range based on the changes in threshold voltage for memory cells programmed to the first and second number of data states.

14. The method of claim 13, wherein the first number of data states includes a second, a third, and a fourth data state; the second number of data states includes a fifth, a sixth, and seventh data state; and the third number of data states includes an eighth and a ninth data state.

15. The method of claim 13, wherein the first number of data states includes a second, a third, a fourth, and fifth data state; the second number of data states includes a sixth and seventh data state; and the third number of data states includes an eighth and ninth data state.

16. An apparatus, comprising:
an array of memory cells; and
a controller operably coupled to the array and configured to:
search threshold voltage data of memory cells programmed to a first number of data states having threshold voltages within a first range of threshold voltages to determine changes between a first time period and a second time period in threshold voltage of memory cells programmed to the first number of data states; and
search threshold voltage data of memory cells programmed to a second number of data states having threshold voltages within a second range of threshold voltages that is shifted from a previous range based on changes in threshold voltage of memory cells programmed to the first number of data states to determine changes in threshold voltage for memory cells programmed to the second number of data states, wherein the first number of data states is different than the second number of data states.

17. The apparatus of claim 16, wherein the second range is shifted based on a linear extrapolation of the changes in threshold voltage for memory cells at each of the first number of data states.

18. The apparatus of claim 16, wherein the second range is shifted based on an average change of the changes in threshold voltage for memory cells at each of the first number of data states.

19. The apparatus of claim 16, wherein the second range is shifted based on a table indicating the changes in threshold voltage for memory cells at each of the first number of data state.

20. The apparatus of claim 16, wherein the controller is configured to shift sensing signals for memory cells programmed to the second number of data states based on the determined changes in threshold voltage for memory cells programmed to the second number of data state.

* * * * *